United States Patent [19]

Imai et al.

[11] Patent Number: 5,061,592

[45] Date of Patent: Oct. 29, 1991

[54] PRESENSITIZED PLATE FOR USE IN MAKING LITHOGRAPHIC PRINTING PLATES

[75] Inventors: Masanori Imai; Tadahiro Sorori, both of Shizuoka, Japan

[73] Assignee: Fuji Photo Film Co., Ltd., Minami-ashigara, Japan

[21] Appl. No.: 514,215

[22] Filed: Apr. 25, 1990

[30] Foreign Application Priority Data

Apr. 27, 1989 [JP]  Japan ................... 1-108289

[51] Int. Cl.$^5$ .............. G03C 1/52; G03F 7/008; G03F 7/028
[52] U.S. Cl. ....................... 430/167; 430/165; 430/157; 430/278; 430/285; 430/283; 430/286; 430/287; 430/164; 430/292; 430/155; 522/115; 522/138; 522/144; 522/88
[58] Field of Search ............ 430/278, 285, 283, 286, 430/287, 164, 292, 155, 167, 165, 157; 522/115, 138, 144, 88

[56] References Cited

U.S. PATENT DOCUMENTS

| | | | |
|---|---|---|---|
| 3,197,308 | 7/1965 | Stahlhofen | 430/278 |
| 4,830,952 | 5/1989 | Penner et al. | 430/287 |
| 4,845,009 | 7/1989 | Kita et al. | 430/175 |

FOREIGN PATENT DOCUMENTS 276029A  7/1988  European Pat. Off. .............. 522/46

Primary Examiner—Cynthia Hamilton
Attorney, Agent, or Firm—Burns, Doane, Swecker & Mathis

[57] ABSTRACT

A presensitized plate for use in making a lithographic printing plate which comprises an aluminum substrate provided thereon with a light-sensitive layer comprising a polymer having at least two photodimerizable unsaturated double bonds in the molecule, wherein the light-sensitive layer further comprises a compound having at least one photodimerizable unsaturated double bond and at least one phosphinyl group in each molecule as well as a molecular weight of not more than 2,000. The presensitized plate shows excellent sensitivity and makes it possible to provide a lithographic printing plate showing high printing durability.

20 Claims, No Drawings

PRESENSITIZED PLATE FOR USE IN MAKING LITHOGRAPHIC PRINTING PLATES

BACKGROUND OF THE INVENTION

The present invention relates to a presensitized plate for use in making a lithographic printing plate and more specifically to a presensitized plate for use in making a lithographic printing plate whose adhesion of a light-sensitive layer to a substrate is improved and which is provided with a light-sensitive layer comprising a photodimerizable polymer.

There have been well-known photocross-linkable materials which cause photocross-linking through a cyclization-addition reaction. These materials have widely been used as principal components of a light-sensitive composition which is employed for making presensitized plates for use in making lithographic printing plates (hereunder referred to as "PS plates") or materials for forming photoresist images. Although these photocross-linkable polymers are highly sensitive and effectively used as photoresists, they have not yet been practically used because of their poor adhesion to a substrate or other layers. Such poor adhesion possibly leads to peeling off of images, formation of defects or the like during rubbing with a brush when an imagewise exposed PS plate is developed and, therefore, sufficient printing durability cannot be imparted to the resulting lithographic printing plates. Moreover, this tendency becomes conspicuous when a PS plate is exposed to light of low intensity and as a result, its sensitivity becomes low.

There have been known a variety of methods for improving adhesion of such a photocross-linkable light-sensitive material to substrates or other layers. For instance, Japanese Patent Un-examined Publication (hereunder referred to as "J.P. KOKAI") No. Sho 62-78544 teaches the addition of a negative-working diazo resin to the light-sensitive layers of PS plates; and J.P. KOKAI No. Sho 62-85255 discloses a method for improving the adhesion by expanding pores of an anodized layer formed on an aluminum substrate to ensure a physical anchor-effect.

However, the addition of diazo resins to light-sensitive layers becomes causes of various problems. For instance, the sensitivity of the layer is lowered; and the stability of pigments (coloring agents) is impaired during storing the light-sensitive composition containing such a diazo resin in the form of a coating solution. In addition, the method for enhancing the anchor-effect of the surface of a substrate suffers from various drawbacks, for instance, the non-image areas of the resulting lithographic printing plate is liable to receive ink during printing. This inevitably leads to background contamination.

SUMMARY OF THE INVENTION

Accordingly, an object of the present invention is to provide a PS plate whose photodimerizable light-sensitive material maintains its high sensitivity.

Another object of the present invention is to provide a PS plate which can provide lithographic printing plates showing excellent printing properties.

The aforementioned objects of the present invention can effectively be achieved by providing a PS plate which comprises an aluminum substrate provided thereon with a light-sensitive layer comprising a polymer having at least two photodimerizable unsaturated double bonds in the molecule, wherein the light-sensitive layer further comprises a compound simultaneously having at least one photodimerizable unsaturated double bond and at least one phosphinyl group in each molecule and a molecular weight of not more than 2,000.

DETAILED EXPLANATION OF THE INVENTION

Typical examples of the functional groups having a photodimerizable unsaturated bond usable in the invention are maleimido groups, cinnamyl groups, cinnamilidene groups and chalcone groups. The light-sensitive polymers having these photodimerizable unsaturated bonds in the main chain or on the side chains thereof will be explained hereunder in more detail.

Examples of the photodimerizable polymers having maleimido groups on the side chains usable in the present invention include those having maleimido groups on the side chains represented by the following general formula (I):

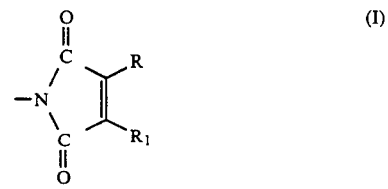

(wherein R and $R_1$ each independently represents an alkyl group having at most 4 carbon atoms or R and $R_1$ may form a 5- or 6-membered carbon ring together) as disclosed in J.P. KOKAI No. Sho 52-988 (corresponding to U.S. Pat. No. 4,079,041), German Patent No. 2,626, 769, European Patent Nos. 21,019 and 3,552 and Die Angewandte Makromolekulare Chemie, 1983, 115, pp. 163–181; and those having maleimido groups on the side chains represented by the following general formula (II):

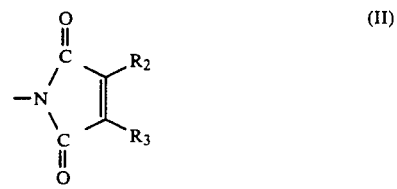

(wherein $R_2$ represents an aromatic group and $R_3$ represents a hydrogen atom, a halogen atom, an alkyl group or a cyano group) as disclosed in J.P. KOKAI Nos. Sho 49-128991, Sho 49-128992, Sho 49-128993, Sho 50-5376, Sho 50-5377, Sho 50-5378, Sho 50-5379, Sho 50-5380, Sho 53-5298, Sho 53-5299, Sho 53-5300, Sho 50-50107, Sho 51-47940, Sho 52-13907, Sho 50-45076, Sho 52-121700, Sho 50-10884 and Sho 50-45087, German Patent Nos. 2,349,948 and 2,616,276.

The average molecular weight of these polymers must be not less than 1,000 and preferably ranges from 10,000 to 100,000. Moreover, these polymers must have, on the side chains, at least two maleimido groups in the molecule on the average. Among these polymers having maleimido groups on the side chains, those having acidic groups are preferably employed. This is because alkaline aqueous solutions can be used as developers and thus possible severe environmental pollution can be prevented. The acid value of the polymers having maleimido groups and acidic groups preferably ranges from 20 to 300 and more preferably 50 to 200. Particularly preferred polymers having such an acid value are copolymers of N-[2-(methacryloyloxy)-ethyl]-2,3-dimethylmaleimide with (meth)acrylic acid as disclosed in Die Angewandte Makromolekulare Chemie, 1984, 128, pp. 71–91. Moreover, multi-component polymers can easily be prepared by adding a third component (e.g., a vinyl monomer) to the monomer mixture for the preferred copolymer during polymerization depending on purposes. For instance, flexibility can be imparted to the copolymer by the use of alkyl (meth)acrylates whose homopolymer has a glass transition point of not more than room temperature as such a third component (vinyl monomer).

In addition to the foregoing polymers, polymers having at least two groups represented by the following general formula (III) or (IV) as the polymer having photodimerizable unsaturated bonds:

$$A-(CH=CH)_n-CH=CX-CO- \quad \text{(III)}$$

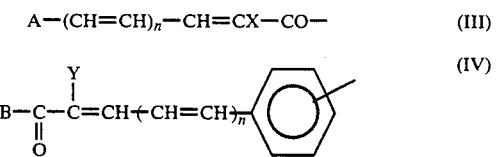

(IV)

wherein A represents an aryl, substituted aryl, furyl or thienyl group; B represents an alkoxy, aryl, substituted aryl or alkyl group; X represents H, CN, a halogen atom or a phenyl or alkyl group; Y represents H, CN, a halogen atom or a phenyl or alkyl group; and n is an integer of 0 or 1.

Specific examples of polymers having at least two groups represented by the general formula (III) or (IV) on the side chains are homopolymers of acrylic acid esters, methacrylic acid esters or vinyl ether compounds which have at least two groups represented by Formula (III) or (IV); copolymers of two or more of these monomers and copolymers of these monomers with optional other addition polymerizable vinyl monomers. Examples of such acrylic acid esters, methacrylic acid esters or vinyl ether compounds which have at least two groups represented by Formula (III) or (IV) include those disclosed in British Patent No. 949,919, Japanese Patent Publication for Opposition Purpose (hereunder referred to as "J.P. KOKOKU") Nos. Sho 45-36755, Sho 46-4603, Sho 49-14352, Sho 49-28122, Sho 50-11283, Sho 50-24621, Sho 51-481, Sho 55-44930, Sho 56-37244, Sho 56-52923 and Sho 57-28488, and J.P. KOKAI Nos. Sho 47-34794, Sho 49-36794 and Sho 49-103975. Among these, preferred are poly(meth)acrylic acid esters or polyvinyl ether compounds which have cinnamic acid ester groups on the side chains. The molecular weight of these light-sensitive polymers preferably ranges from 2,000 to 1,000,000 and more preferably 10,000 to 200,000.

Besides, examples of the polymers having photodimerizable unsaturated bonds in the main chain usable in the present invention include light-sensitive polyesters obtained by condensing phenylene diacrylic acid or alkyl esters thereof with glycol, which are highly sensitive to light.

It has been tried to make these polymers soluble in an alkaline aqueous solution. For instance, J.P. KOKAI No. Sho 60-191244 discloses a light-sensitive composition which comprises light-sensitive polymers in which carboxyl groups are introduced into the side chains thereof and which can be developed with an alkaline water. In addition, U.S. Pat. No. 2,861,058 discloses a method for obtaining light-sensitive polymers which comprises reacting hydroxyl groups of a polyvinyl alcohol with cinnamic acid chloride and an acid anhydride to thus impart both light-sensitivity and alkaline water-solubility to the polymer; U.S. Pat. No. 2,835,656 discloses a method for reacting a copolymer of maleic anhydride and styrene with β-hydroxyethyl-cinnamic acid ester; U.S. Pat. No. 3,357,831 discloses a method for introducing methacrylic acid moiety into cinnamic acid-acrylic ester copolymers; U.S. Pat. No. 3,702,765 discloses a method which comprises esterifying a phenoxy resin with p-phenylene diacrylic acid monoethyl ester and subsequently hydrolyzing the esterified product; and J.P. KOKAI No. Sho 63-218945 discloses a variety of methods such as that comprising adding an active mercapto carboxylic acid to a part of unsaturated double bonds of a polymer.

The light-sensitive layer may comprise at least one light-sensitive polymer explained above in an amount ranging from about 20 to 99% and preferably 50 to 99% by weight on the basis of the total weight of the light-sensitive layer.

In the present invention, the light-sensitive layer may optionally comprise one or more sensitizers. Preferred such sensitizers are, for instance, triplet photosensitizers which show a maximum absorption at a wavelength of not less than 300 nm so as to practically absorb sufficient quantity of light.

Specific examples thereof are thioxanthone, benzophenone derivatives, benzanthrone derivatives, quinones, aromatic nitro compounds, naphthothiazoline derivatives, benzothiazoline derivatives, naphthothiazoline derivatives, ketocoumarin compounds, benzothiazole derivatives, naphthofuranone compounds, pyrylium salts and thiapyrylium salts. More specifically, there may be mentioned, for instance, thioxanthone, chlorothioxanthone, 2-isopropylthioxanthone, dimethylthioxanthone, methylthioxanthone-1-ethylcarboxylate, Michler's ketone, N,N'-diethylaminobenzophenone, benzanthrone, (3-methyl-1,3-diaza-1,9-benz)anthrone picramide, 5-nitroacenaphthene, 2-chlorothioxanthone, 2-nitrofluorene, 2-benzoylmethylene-3-methylnaphthothiazoline, 3,3-carbonyl-bis(7-diethylaminocoumarin), 2,4, 6-triphenyl thiapyrylium perchlorate and 2-(p-chlorobenzoyl) naphthothiazole. In addition, it is also effective to use electron accepting compounds such as 1,2-dicyanobenzene, chloranil and 2,3-dichloro-5,6-dicyanobenzoquinone as disclosed in J.P. KOKAI No. Sho 59-206425.

The amount of these sensitizers preferably ranges from about 1 to 20% by weight and more preferably 3 to 10% by weight based on the total weight of the light-sensitive layer.

The compounds having at least one photodimerizable unsaturated bond and at least one phosphinyl group in each molecule as well as a molecular weight of not more than 2,000, which are used in the present invention are those having at least one photodimerizable unsaturated bond represented by the foregoing general formulas (I) to (IV) and at least one phosphinyl group represented by the following general formula (V):

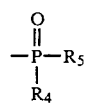
(V)
wherein $R_4$ and $R_5$ each independently represents a hydroxyl group, an alkoxy group having 1 to 4 carbon atoms, a benzyloxy group, an aryloxy group, a trimethylsilyloxy group or a halogen atom.
Specific examples of such compounds are as follows:
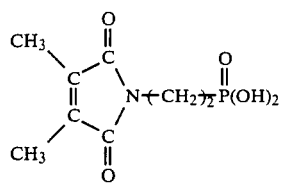
(1)
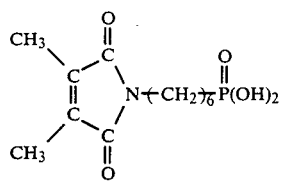
(2)
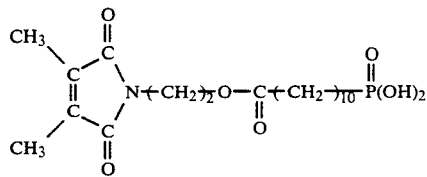
(3)
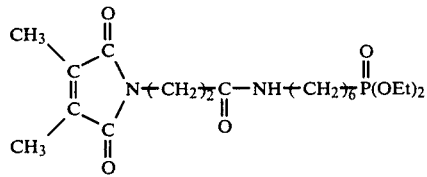
(4)
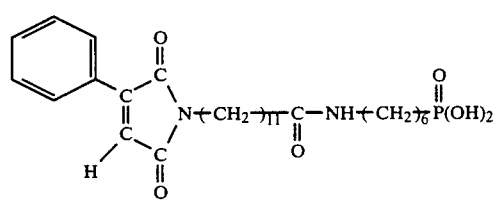
(5)
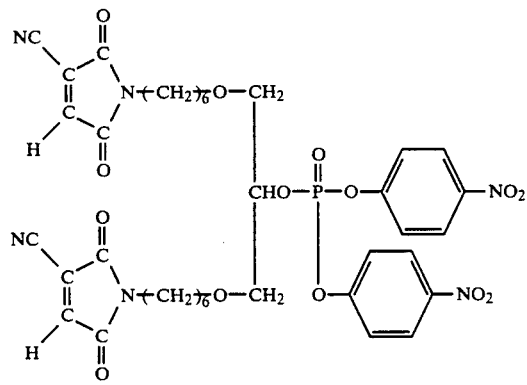
(6)

-continued
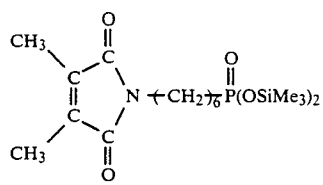 (7)
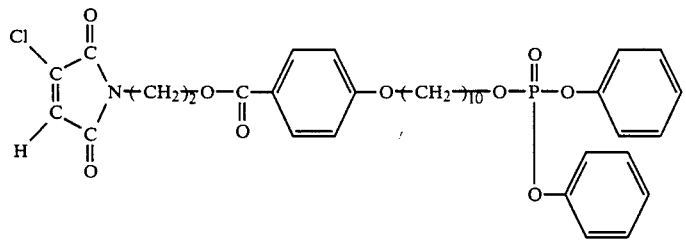 (8)
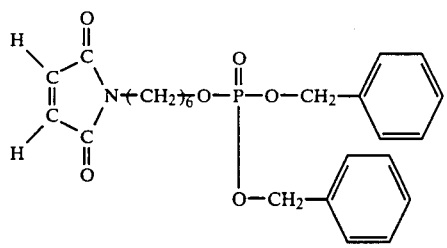 (9)
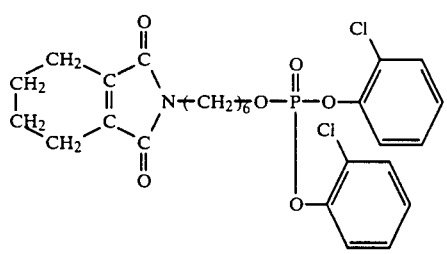 (10)
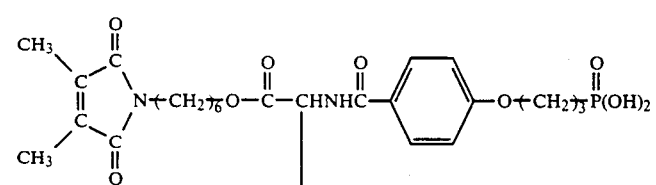 (11)
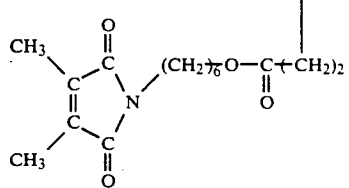 (12)
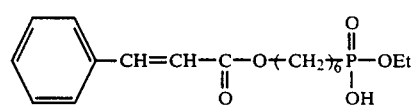 (13)
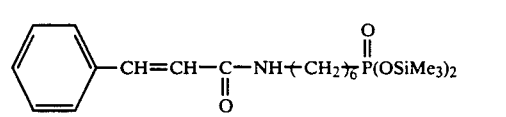 (14)

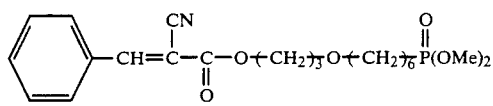
(15)

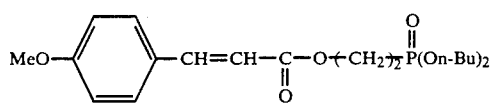
(16)

The adhesion between an aluminum substrate and a light-sensitive layer can be enhanced by incorporating these compounds into either or both of an intermediate adhesive layer and the light-sensitive layer. The phosphinyl group has good affinity with aluminum and ability to be adsorbed thereon. On the other hand, the photodimerizable unsaturated bonds can react with the photodimerizable polymer present in the light-sensitive layer. For this reason, the adhesion between the light-sensitive layer and the substrate is deemed to be enhanced. These compounds may be used alone or in combination in the present invention.

If these compounds are employed for forming an intermediate adhesive layer, it is sufficient to dissolve them in a proper solvent and then to apply the resulting solution onto the surface of the aluminum substrate in a desired thickness. The thickness thereof may vary over a wide range, but it must be such that uniform linkages with the upper light-sensitive layer can be ensured upon imagewise exposure of the same. It in general ranges from 1 to 100 mg/m$^2$ and particularly 5 to 40 mg/m$^2$ (determined after drying). The intermediate adhesive layer may further comprise sensitizers, halation inhibiting agents, polymer binders, surfactants and/or other various additives.

Alternatively, if they are incorporated into the light-sensitive layer (or light-sensitive composition for making the light-sensitive layer), the amount thereof generally ranges from 1 to 50% by weight and preferably 2 to 40% by weight based on the total weight of the light-sensitive layer.

Further, it is preferable to add, to the light-sensitive layer, heat polymerization inhibitors and/or antioxidants. Examples of useful such additives include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole.

The foregoing light-sensitive composition may optionally comprise a binder which is generally appropriately selected from linear organic high molecular weight polymers. Specific examples of the binders are chlorinated polyethylenes, chlorinated polypropylenes, polyalkyl acrylates, copolymers of alkyl acrylates with at least one monomer selected from the group consisting of acrylonitrile, vinyl chloride, styrene, butadiene and the like, polyamides, methyl cellulose, polyvinyl formal, polyvinyl butyral, methacrylic acid copolymers, acrylic acid copolymers, itaconic acid copolymers and diazo resins.

The light-sensitive composition may also optionally comprise dyes or pigments for the purpose of coloring of the light-sensitive layer. Specific examples thereof are Methylene Blue, Crystal Violet, Rhodamine B, Fuchsine, Auramine, azo dyes, anthraquinone dyes, titanium oxide, carbon black, iron oxide, phthalocyanine type pigments and azo pigments.

Moreover, the light-sensitive composition may comprise, as agents or compositions for obtaining an image immediately after imagewise exposure, a combination of an agent which photolytically generates an acid (such as a triazine type or oxazole type trihalomethyl compound) with a pH indicator or a combination of an azido compound or diazo compound with a leuco dye or spiropyran compound.

The aforementioned light-sensitive composition is dissolved in a proper solvent such as 2-methoxyethanol, 2-methoxyethyl acetate, propylene glycol monomethyl ether, 3-methoxypropanol, 3-methoxypropyl acetate, methyl ethyl ketone or ethylene dichloride which may be used alone or in combination and applied onto the surface of a substrate. The amount of the light-sensitive composition to be coated preferably ranges from about 0.1 g/m$^2$ to about 10 g/m$^2$ and more preferably 0.5 to 5 g/m$^2$.

The substrate used in the present invention is preferably an aluminum plate (inclusive of aluminum alloy plates) because of its substantially high dimensional stability, low cost and good adhesion to the light-sensitive composition. In addition, a composite sheet obtained by laminating a polyethylene terephthalate film with an aluminum sheet as disclosed in J. P. KOKOKU No. Sho 48-18327 is also preferably employed in the present invention.

If a metal substrate, in particular an aluminum substrate is used, it is preferably subjected to a surface treatment such as graining and anodization.

Moreover, to enhance hydrophilicity of the surface of these aluminum substrates, they can be treated by immersing into an aqueous solution of sodium silicate, potassium fluorozirconate, phosphoric acid salts or the like; or they are grained and then immersed in an aqueous solution of sodium silicate as disclosed in U.S. Pat. No. 2,714,066; or they are anodized and then immersed in an aqueous solution of an alkali metal silicate as disclosed in J. P. KOKOKU No. Sho 47-5125.

In addition, a silicate electro-deposition treatment as disclosed in U.S. Pat. No. 3,658,662 is also effective in the invention.

Further, it is also effective to use a surface treatment comprising a combination of an electrolytic graining with the aforementioned anodization and the treatment with a sodium silicate solution as described in J. P. KOKOKU No. Sho 46-27481 and J. P. KOKAI Nos. Sho 52-58602 and Sho 52-30503.

Other examples of preferred aluminum substrates are those subjected to, in order, brush graining, electrolytic graining, anodization and optionally a treatment with a sodium silicate solution. After these surface treatments, the aluminum substrate is suitably coated with an underlying coating of, for instance, a water-soluble resin such as polyvinyl phosphonic acid, homopolymers or copolymers having sulfonate groups on the side chains and polyacrylic acids.

These hydrophilization treatments are carried out not only to make the surface of the substrate hydrophilic but to prevent any detrimental reaction with the light-sensitive layer to be applied thereto and to further enhance the adhesion to the light-sensitive layer and/or an intermediate layer.

The PS plate of the present invention is imagewise exposed to light from a light source rich in ultraviolet rays such as a metal halide lamp and a high pressure mercury lamp, developed with a developer to remove the un-exposed portions on the light-sensitive layer and then coated with a gumming solution to thus give a lithographic printing plate. The plate thus obtained may be subjected to post-exposure, after the development, in order to improve the printing durability of the resulting lithographic printing plate.

The PS plates of the present invention can preferably be developed with a developer comprising an aqueous solution of an inorganic alkali selected from sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and ammonia. The concentration of the inorganic alkali in the aqueous alkaline solution in general ranges from 0.1 to 10% by weight and preferably 0.5 to 5% by weight.

The aqueous alkaline solution may optionally comprise surfactants and/or organic solvents such as alcohols. Preferred examples of such organic solvents are benzyl alcohol, 2-phenoxyethanol, 2-butoxyethanol and n-propyl alcohol. Further, developers as described in U.S. Pat. Nos. 3,475,171 and 3,615,480; and those disclosed in J. P. KOKAI No. Sho 50-26601 and J. P. KOKOKU Nos. Sho 56-39464 and Sho 56-42860 can also be employed for developing the imagewise exposed PS plate of the present invention.

The light-sensitive layer of the PS plate of the present invention comprises a specific compound, i.e., a compound having at least one photodimerizable unsaturated double bond and at least one phosphinyl group in each molecule as well as a molecular weight of not more than 2,000 in addition to the photodimerizable and photo-cross-linkable material. The former ensures the excellent sensitivity of the light-sensitive material and makes it possible to provide a lithographic printing plate showing high printing durability.

The PS plate of the present invention will hereunder be explained in more detail with reference to the following non-limitative working Examples and the effects practically achieved by the invention will also be discussed in detail in comparison with Comparative Examples.

EXAMPLE 1

The surface of an aluminum plate having a thickness of 0.30 mm was grained with a nylon brush and a suspension of 400 mesh pumice stone and then washed with water sufficiently. The plate was immersed in a 10% sodium hydroxide solution maintained at 70° C. for 60 seconds to perform etching, washed with running water, neutralized and washed with a 20% nitric acid solution and then washed with water. Thereafter, the aluminum plate was subjected to an electrolytic surface roughening treatment by the use of sinusoidal alternating waved current in a 1% aqueous nitric acid solution, the conditions for the treatment being $V_a$ of 12.7 V and the quantity of anode time electricity of 160 coulomb/dm². The surface roughness thereof was found to be 0.6μ (expressed in terms of center line average height (Ra unit)). Subsequently, the plate was immersed in a 30% aqueous solution of sulfuric acid at 55° C. for 2 minutes to desmut the plate, then anodized in a 20% aqueous sulfuric acid solution at a current density of 2 A/dm² so that the amount of the resulting anodized layer was 2.7 g/m².

Then a coating solution for forming an intermediate layer having the following composition was prepared.

| Component | Amount (g) |
| --- | --- |
| Compound of the formula:<br>$$\begin{array}{c}CH_3\\ \phantom{CH_3}\diagdown\\ \phantom{CH_3}\phantom{xx}C\diagup\diagdown\\ \phantom{CH_3xxxx}\|\phantom{xx}\diagdown\phantom{x}O\\ \phantom{CH_3xxxx}\|\phantom{xxxx}N{+}CH_2{\rightarrow}_{\overline{2}}\overset{\|}{P}(OH)_2\\ \phantom{CH_3xxx}C\diagup\diagup\\ \phantom{CH_3}\diagup\phantom{xx}\|\\ CH_3\phantom{xxx}O\end{array}$$ | 0.1 |
| Methanol | 100 |
| Pure water | 50 |

The coating solution was applied to the surface of the aluminum substrate with a whirler so that the amount thereof coated was equal to 10 mg/m² (determined after drying). Then the coated layer was dried at 80° C. for one minute.

A solution I of the light-sensitive composition having the following composition (hereunder referred to as "light-sensitive solution") was prepared.

| Light-sensitive Solution I | |
| --- | --- |
| Component | Amount (g) |
| Methyl methacrylate/N-[2-(methacryloyloxy)ethyl]-2,3-dimethylmaleimide/methacrylic acid (5/65/30; molar ratio) copolymer | 5 |
| Sensitizer represented by the following structural formula:<br>$$\begin{array}{c}\phantom{xxxxx}O\\ \phantom{xxxxx}\|\\ CH_3{-}\text{(aromatic ring)}{-}C{-}\text{(aromatic ring)}\\ \phantom{xxxxxxxxx}\diagdown S\diagup\phantom{xxx}COOC_2H_5\end{array}$$ | 0.5 |
| Megafac F-177 (fluorine atom-containing nonionic surfactant available from DAINIPPON INK AND CHEMICALS, INC.) | 0.02 |
| 10% Cu-phthalocyanine pigment (CI Pigment Blue 15) dispersion in a plasticizer | 1.0 |
| Methyl ethyl ketone | 20 |
| Methanol | 2 |
| Propylene glycol monomethyl ether | 28 |

This light-sensitive solution I was applied onto the intermediate layer formed on the substrate with a whirler so that the amount coated was equal to 1.0 g/m² (determined after drying). Then the coated layer was dried at 80° C. for 2 minutes to thus obtain a PS plate A.

COMPARATIVE EXAMPLE 1

A PS plate B was prepared by applying the foregoing light-sensitive solution onto the surface of the same substrate used in Example 1 without applying any intermediate layer to the substrate so that the coated amount of the solution was equal to 1.0 g/m$^2$ (determined after drying).

The PS plates A and B thus obtained were exposed to light in the usual manner in which a vacuum printing frame was employed, i.e., by placing a step wedge (density difference between adjacent steps=0.15 and the number of steps=15) on the plate and irradiating it with 2 KW super high pressure mercury lamp for 60 seconds and then developed by immersing it in a 5% by weight aqueous sodium silicate solution for about one minute. They were then washed with water and dried to obtain lithographic printing plates A and B. The plates A and B were set up on a printing press (KOR-D type available from Heidelberg Co., Ltd.) to perform printing.

Sensitivity and printing properties of these lithographic printing plates are as shown in the following Table I.

TABLE I

| Printing Plate | Sensitivity (max. No. of Step-wedge) | Resistance to formation of Defects | Printing Durability* |
|---|---|---|---|
| A | 9 | good | 50,000 |
| B | 7 | slightly damaged | 35,000 |

*The number of printed copies

EXAMPLE 2

The following light-sensitive solution II was applied onto the surface of the same substrate used in Example 1 without applying any intermediate layer on the substrate and then dried in the same manner as in Example 1.

| Light-sensitive Solution II | |
|---|---|
| Component | Amount (g) |
| N-[2-(methacryloyloxy)ethyl]-2,3-dimethyl maleimide/methacrylic acid (molar ratio = 65/35) copolymer | 5 |
| Sensitizer represented by the following formula: | 0.3 |

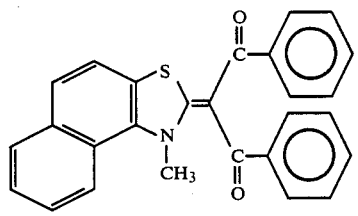

| | |
|---|---|
| Compound represented by the following formula: | 0.5 |

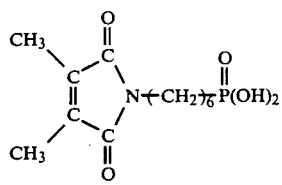

| | |
|---|---|
| F-177 | 0.02 |
| 10% copper phthalocyanine pigment (CI Pigment Blue 15) dispersion in a plasticizer | 1.0 |
| Methyl ethyl ketone | 20 |
| Methanol | 5 |

| Light-sensitive Solution II | |
|---|---|
| Component | Amount (g) |
| Ethylene glycol monomethyl ether | 30 |

The resulting PS plate was exposed to light and developed in the same manner as in Example 1 to obtain a lithographic printing plate C.

COMPARATIVE EXAMPLE 2

A light-sensitive solution having the same composition as that for the light-sensitive solution II except that the compound represented by the following formula:

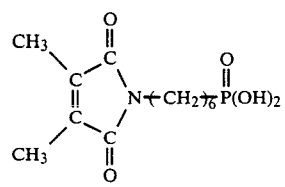

was omitted and the solution was applied and dried in the same manner used above in Example 2 to obtain a PS plate D.

Lithographic printing plates C and D were prepared by exposing the PS plates C and D to light and developing them as in Example 1.

Sensitivity and printing properties of these lithographic printing plates are as shown in the following Table II.

TABLE II

| Printing Plate | Sensitivity (max. No. of Step-wedge) | Resistance to formation of Defects | Printing Durability* |
|---|---|---|---|
| C | 9 | good | 50,000 |
| D | 7.5 | slightly damaged | 40,000 |

*The number of printed copies

EXAMPLE 3

The surface of an aluminum substrate was treated in the same manner as in Example 1.

Then a coating solution for intermediate layers having the following composition was prepared.

| Coating Solution | |
|---|---|
| Component | Amount (g) |
| Compound represented by the following formula: | 0.2 |

$$\text{C}_6\text{H}_5-\text{CH}=\text{CH}-\overset{\text{O}}{\underset{\|}{\text{C}}}-\text{O}\text{+CH}_2\text{)}_6\text{P}-(\text{OH})_2$$

| | |
|---|---|
| Propylene glycol monomethyl ether | 100 |
| F-177 | 0.03 |

The coating solution was applied to the surface of the substrate and then dried in the same manner as in Example 1.

A light-sensitive solution III having the following composition was prepared.

| Light-sensitive Solution III | |
|---|---|
| Component | Amount (g) |
| β-cinnamoyloxyethyl methacrylate/methacrylic acid (molar ratio = 70/30) copolymer | 5.0 |
| Sensitizer having the following formula: | 0.4 |

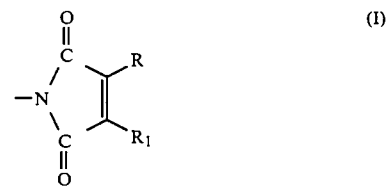

| | |
|---|---|
| Diethyl phthalate | 0.5 |
| 10% copper phthalocyanine pigment (CI Pigment Blue 15) dispersion in a plasticizer F-177 | 1.0 |
| | 0.02 |
| Methyl ethyl ketone | 20 |
| Methanol | 2 |
| Propylene glycol monomethyl ether | 28 |

On the substrate to which the intermediate layer had been applied, the light-sensitive solution III was applied with a whirler so that the coated amount thereof was 1.0 g/m² (determined after drying) and then dried at 80° C. for 2 minutes to obtain a PS plate E.

COMPARATIVE EXAMPLE 3

A PS plate F was prepared according to the same procedures as in Example 3 except that any intermediate layer was not formed.

The PS plates E and F thus obtained were exposed to light in the same manner as in Example 1 and then developed with the following developer.

| Developer | |
|---|---|
| Component | Amount (g) |
| Benzyl alcohol | 4.5 |
| A 38% aqueous solution of sodium isopropyl-naphthalene sulfonate | 4.5 |
| A 40% aqueous solution of No. 3 sodium silicate (JIS Standard) | 2.0 |
| Sodium sulfite | 0.3 |
| Pure water | 100 |

The developed plates E and F were washed with water and dried to obtain lithographic printing plates E and F. Sensitivity and printing properties of these lithographic printing plates are as shown in the following Table III.

TABLE III

| Printing Plate | Sensitivity (max. No. of Step-wedge) | Resistance to formation of Defects | Printing Durability* |
|---|---|---|---|
| E | 8 | good | 45,000 |
| F | 6.5 | slightly damaged | 35,000 |

*The number of copies

When the plate F was used, defects were formed on the highlight of its half-tone dot portions during printing.

What is claimed is:

1. A presensitized plate for use in making a lithographic printing plate which comprises an aluminum substrate provided thereon with a light-sensitive layer comprising a polymer having at least two photodimerizable unsaturated double bonds in the molecule, wherein the light-sensitive layer further comprises a compound having at least one photodimerizable unsaturated double bond and at least one phosphinyl group in each molecule as well as a molecular weight of not more than 2,000.

2. The presensitized plate of claim 1 wherein the polymer having at least two photodimerizable unsaturated double bonds in the molecule has maleimido groups on the side chains, said polymer being selected from the group consisting of those having maleimido groups on the side chains represented by the following general formula (I):

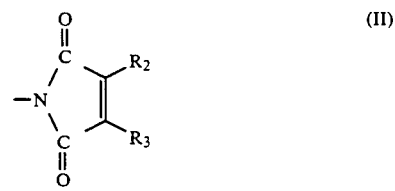

(wherein R and R₁ each independently represents an alkyl group having at most 4 carbon atoms or R and R₁ together represent a 5- or 6-membered carbon ring and those having, on the side chains, maleimido groups represented by the following general formula (II):

$$\begin{array}{c} O \\ \parallel \\ C \\ -N \diagdown \diagup R_2 \\ \diagdown C \diagdown R_3 \\ \parallel \\ O \end{array} \quad (II)$$

(wherein R₂ represents an aromatic group and R₃ represents a hydrogen atom, a halogen atom, an alkyl group or a cyano group).

3. The presensitized plate of claim 2 wherein the average molecular weight of the polymer ranges from 10,000 to 100,000 and the polymer has, on the side chains, at least two maleimido groups in the molecule on the average.

4. The presensitized plate of claim 2 wherein the polymer having maleimido groups on the side chains is selected from the group consisting of those having acidic groups and the acid value of the polymer having maleimido groups and acidic groups ranges from 20 to 300.

5. The presensitized plate of claim 1 wherein the polymer having photodimerizable unsaturated double bonds is selected from the group consisting of those having at least two groups represented by the following general formula (III) or (IV):

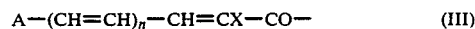

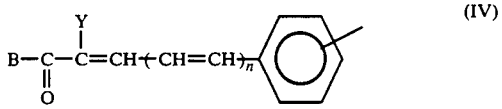

wherein A represents an aryl, furyl or thienyl group; B represents an alkoxy, aryl or alkyl group; X represents H, CN, a halogen atom or a phenyl or alkyl groups; Y represents H, CN, a halogen atom or a phenyl or alkyl group; and n is an integer of 0 or 1.

6. The presensitized plate of claim 5 wherein the polymer is selected from the group consisting of poly(meth)acrylic acid esters and polyvinyl ether compounds which have cinnamic acid ester groups on the side chains.

7. The presensitized plate of claim 1 wherein the molecular weight of the light-sensitive polymer ranges from 2,000 to 1,000,000.

8. The presensitized plate of claim 1 wherein the amount of the light-sensitive polymer ranges from about 20 to 99% on the basis of the total weight of the light-sensitive layer.

9. The presensitized plate of claim 1 wherein the amount of the light-sensitive polymer ranges from 50 to 99% by weight on the basis of the total weight of the light-sensitive layer.

10. The presensitized plate of claim 1 wherein the light-sensitive layer further comprises a sensitizer selected from triplet photosensitizers which show a maximum absorption at a wavelength of not less than 300 nm.

11. The presensitized plate of claim 10 wherein the triplet photosensitizer is selected from the group consisting of thioxanthones, benzophenones, benzanthrones, quinones, aromatic nitro compounds, naphthothiazolines, benzothiazolines derivatives, benzothiazoline derivatives, naphthothiazoline, ketocoumarin compounds, benzothiazoles, naphthofuranone compounds, pyrylium salts and thiapyrylium salts.

12. The presensitized plate of claim 11 wherein the amount of the sensitizer ranges from about 1 to 20% by weight on the basis of the total weight of the light-sensitive layer.

13. The presensitized plate of claim 1 wherein the compound having at least one photodimerizable unsaturated double bond and at least one phosphinyl group in each molecule as well as a molecular weight of not more than 2,000 is selected from the group consisting of those having at least one photodimerizable unsaturated double bond represented by the general formulas (I) to (IV) as follows:

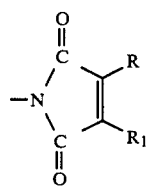
(I)

(wherein R and R₁ each independently represents an alkyl group having at most 4 carbon atoms or R and R₁ together represent a 5-or 6- membered carbon ring) and those having, on the side chains, maleimido groups represented by the following general formula (II):

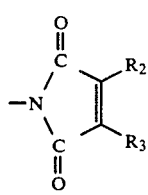
(II)

(wherein R₂ represents an aromatic group R₃ represents a hydrogen atom, a halogen atom, an alkyl group or a cyano group);

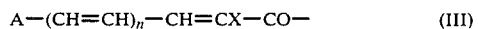
A—(CH=CH)ₙ—CH=CX—CO— (III)

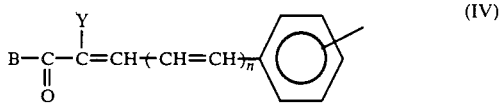
(IV)

wherein A represents an aryl, furyl or thienyl group; B represents an alkoxy, aryl or alkyl group; X represents H, CN, a halogen atom or a phenyl or alkyl groups; Y represents H, CN, a halogen atom or a phenyl or alkyl group; and n is an integer of 0 or 1; and at least one phosphinyl group represented by the following general formula (V):

(V)

wherein R₄ and R₅ each independently represents a hydroxyl group, an alkoxy group having 1 to 4 carbon atoms, a benzyloxy group, an aryloxy group, a trimethylsilyloxy group or a halogen atom.

14. The presensitized plate of claim 1 wherein it further comprises an intermediate adhesive layer and either or both of the intermediate layer and the light-sensitive layer comprise at least one compound having at least one photodimerizable unsaturated double bond represented by the general formulas (I) to (IV) as follows:

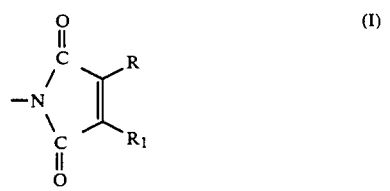
(I)

(wherein R and R₁ each independently represents an alkyl group having at most 4 carbon atoms or R and R₁ together represent a 5-or 6-membered carbon ring) and those having, on the side chains, maleimido groups represented by the following general formula (II):

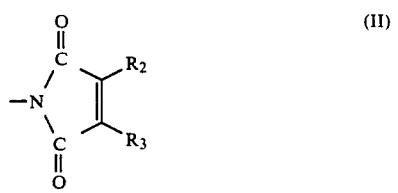
(II)

(wherein R₂ represents an aromatic group and R₃ repesents a hydrogen atom, a halogen atom, an alkyl group or a cyano group);

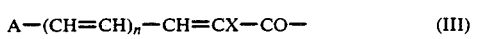
A—(CH=CH)ₙ—CH=CX—CO— (III)

-continued

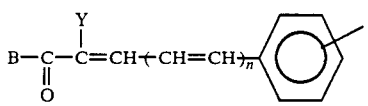
(IV)

wherein A represents an aryl, furyl or thienyl group; B represents an alkoxy, aryl or alkyl group; X represents H, CN, a halogen atom or a phenyl or alkyl groups; Y represents H, CN, a halogen atom or a phenyl or alkyl group; and n is an integer of 0 or 1; and at least one phosphinyl group represented by the following general formula (V);

(V)

wherein $R_4$ and $R_5$ each independently represents a hydroxyl group, an alkoxy group having 1 to 4 carbon atoms, a benzyloxy group, an aryloxy group, a trimethylsilyloxy group or a halogen atom.

15. The presensitized plate claim 14 wherein the compound is incorporated in the intermediate adhesive layer in an amount ranging from 1 to 100 mg/m².

16. The presensitized plate of claim 15 wherein the compound is incorporated into the light-sensitive layer in an amount ranging from 1 to 50% by weight on the basis of the total weight of the light-sensitive layer.

17. The presensitized plate of claim 1 wherein the light-sensitive layer further comprises heat polymerization inhibitors and/or antioxidants selected from the group consisting of hydroquinone, p-methoxyphenol, di-t-butyl-p-cresol, pyrogallol, t-butylcatechol, benzoquinone, 4,4'-thiobis (3-methyl-6-t-butylphenol), 2,2'-methylenebis(4-methyl-6-t-butylphenol),2,2'-methylenebis (4-methyl-6-t-butylphenol) and 2-mercaptobenzimidazole.

18. The presensitized plate of claim 1 wherein the light-sensitive layer further comprises, as a binder, a linear organic high molecular weight polymers selected from the group consisting of chlorinated polyethylenes, chlorinated polypropylenes, polyalkyl acrylates, copolymers of alkyl acrylates with at least one monomer selected from the group consisting of acrylonitrile, vinyl chloride, styrene, butadiene, polyamides, methyl cellulose, polyvinyl formal, polyvinyl butyral, methacrylic acid copolymers, acrylic acid copolymers and itaconic acid copolymers.

19. The presensitized plate of claim 1 wherein the light-sensitive composition further comprises dyes or pigments selected from the group consisting of Methylene Blue, Crystal Violet, Rhodamine B, Fuchsine, Auramine, azo dyes, anthraquinone dyes, titanium oxide, carbon black, iron oxide, phthalocyanine type pigments and azo pigments; and, as agents or compositions for obtaining an image immediately after imagewise exposure, a combination of an agent which photolytically generates an acid with a pH indicator or a combination of an azido compound or diazo compound with a leuco dye or spiropyran compound.

20. The presensitized plate of claim 1 wherein the light sensitive layer further comprises a light sensitive diazo resin.

* * * * *